（12）United States Patent  (10) Patent No.: US 8,199,192 B2
Okabe  (45) Date of Patent: Jun. 12, 2012

(54) OBSERVATION UNIT

(75) Inventor: Akira Okabe, Ohmura (JP)

(73) Assignee: Epicrew Corporation, Nagasaki (JP)

( * ) Notice: Subject to any disclaimer, the term of this patent is extended or adjusted under 35 U.S.C. 154(b) by 1540 days.

(21) Appl. No.: 11/605,158

(22) Filed: Nov. 27, 2006

(65) Prior Publication Data

US 2007/0125962 A1  Jun. 7, 2007

(30) Foreign Application Priority Data

Dec. 6, 2005 (JP) .................................. 2005-352410

(51) Int. Cl.
*H04N 7/18* (2006.01)
(52) U.S. Cl. ............. 348/83; 348/80; 702/154; 430/350
(58) Field of Classification Search .................... 348/83, 348/80; 702/154; 430/350
See application file for complete search history.

(56) References Cited

U.S. PATENT DOCUMENTS

| | | | | |
|---|---|---|---|---|
| 6,002,993 A | * | 12/1999 | Naito et al. | 702/154 |
| 2004/0038156 A1 | * | 2/2004 | Oyamada et al. | 430/350 |

FOREIGN PATENT DOCUMENTS

| | | |
|---|---|---|
| JP | 9-232209 | 9/1997 |
| JP | 9307795 | 11/1997 |
| JP | 2002-294243 | 10/2002 |
| JP | 2004-064253 | 2/2004 |
| JP | 2004-109828 | 4/2004 |

* cited by examiner

*Primary Examiner* — Tammy Nguyen

(74) *Attorney, Agent, or Firm* — Jordan and Hamburg LLP

(57) ABSTRACT

It is an object of the present invention to provide an observation unit which efficiently cools apparatus members in a reaction chamber of a semiconductor manufacturing apparatus in a high-temperature atmosphere and reduces overexposure. An observation unit comprising: an imaging apparatus for imaging the inside of a reaction chamber of a semiconductor manufacturing apparatus in an atmosphere of a high temperature; a housing case which houses the imaging apparatus and is attached with a translucent member which guides an optical image of the inside of the reaction chamber to the imaging apparatus; and a cooling medium supplying apparatus for supplying a cooling medium to the inside of the housing case, wherein the translucent member is a silica glass plate having a gold film on both sides or one side.

11 Claims, 3 Drawing Sheets

F I G.2
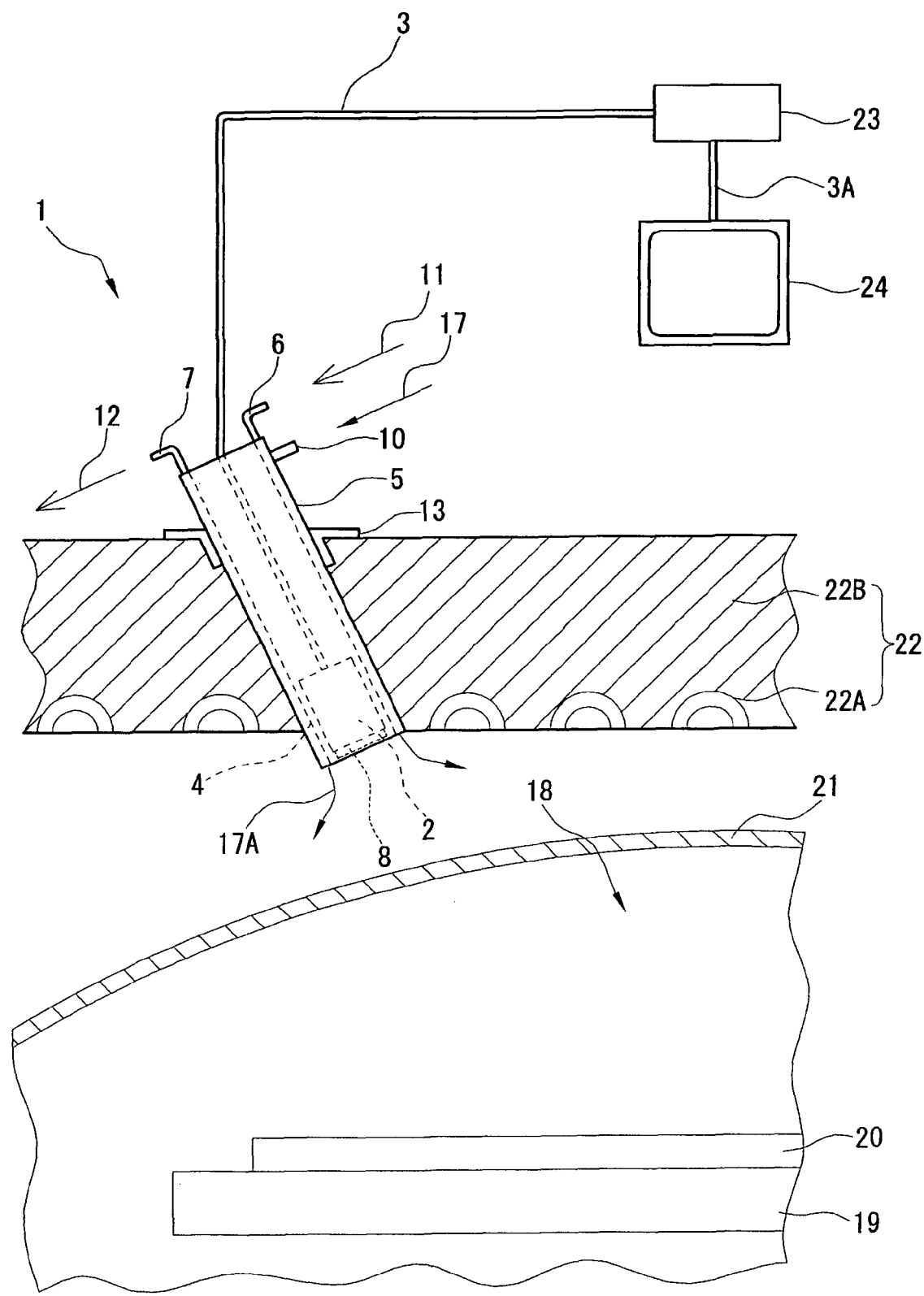

OBSERVATION UNIT

BACKGROUND OF THE INVENTION (1) Field of the Invention

The present invention relates to an observation unit. More specifically, the present invention relates to an observation unit with which the inside of a reaction chamber of a semiconductor manufacturing apparatus in an atmosphere of a high temperature can be observed.

(2) Description of Related Art

A vapor phase epitaxial growth system to be used for manufacturing a semiconductor is an apparatus in which a semiconductor substrate is placed on a susceptor disposed inside a reaction chamber of the apparatus and a reactive gas containing a source gas of $SiHCl_3$, etc., and a carrier gas of hydrogen, etc., is supplied to the inside of the reaction chamber and the semiconductor substrate is heated to deposit and grow silicon single crystal on the semiconductor substrate.

By this heating in a vapor phase epitaxial growth system, the inside of the reaction chamber reaches an atmosphere of a high temperature of about 1100° C., and on the other hand, due to this high temperature heating, deformation such as warping of the semiconductor substrate occurs, and if the epitaxial crystal growth reaction is continued with this deformation left, an undesired epitaxial layer is formed on the back side of the semiconductor substrate.

To investigate whether such an undesired epitaxial layer has been formed, it is considered that the semiconductor substrate is taken out from the reaction chamber after the epitaxial crystal growth reaction ends and investigation as to whether the semiconductor substrate has deformation such as warping is made by visually checking it, however, when the semiconductor substrate is taken out, such deformation may have been restored, and it is difficult to judge whether deformation had been occurred during the epitaxial crystal growth reaction.

Concerning the inside of the reaction chamber, it has been demanded to observe the state and situation of the inside of the reaction chamber during the epitaxial crystal growth reaction to check a phenomenon in which the semiconductor substrate is displaced from a predetermined position on the susceptor which the semiconductor substrate is placed on and a phenomenon in which the semiconductor substrate is damaged. Coating on a quartz dome forming the reaction chamber has great influence on the epitaxial crystal growth reaction, and it has also been demanded to observe the quartz dome.

As an apparatus for observing the inside of the chamber in an atmosphere of a high temperature, for example, Japanese Patent No. 2891672 describes an image taking part 101 of a high-temperature atmosphere furnace interior observation unit including an outer cylinder 102 formed in a cylindrical shape, a first inner cylinder 103 disposed inside this outer cylinder 102 and formed into a length which makes its tip end slightly higher than a tip end of the outer cylinder 102, a second inner cylinder 104 disposed inside this first inner cylinder 103 and whose tip end is extended to the same position as the tip end of the outer cylinder 102, a ring-shaped closing plate 105 which closes the tip end sides of the second inner cylinder 104 and the outer cylinder 102, a third inner cylinder 106 disposed inside the second inner cylinder 104, a heat ray cut filter 108 which is disposed at the tip end portion of the third inner cylinder 106, takes-in an optical image from a monitor window 107 formed at a central portion of the closing plate 105 and transmits only visible light components while cutting heat ray components, a CCD camera 109 which is disposed above the heat ray cut filter 108 inside the third inner cylinder 106 and converts the optical image (visible light image) transmitted through the heat ray cut filter into an electrical signal (video signal) and supplies it to an upper part, a pipe 110 forming a spiral flow channel 111 by spirally partitioning a cylindrical space formed between the first inner cylinder 103 and the second inner cylinder 104, and a thermocouple 112 which is disposed near the CCD camera 109 and measures the temperature of this CCD camera 109 portion and supplies the result of measurement to the upper part via a compensating lead wire 113.

With this constitution, it becomes possible to continuously observe the state of the inside of a furnace in a high-temperature atmosphere such as an electric furnace or a coke oven while efficiently cooling the image taking part, the heat ray cut filter, and the CCD camera, etc. FIG. 3 is a schematic view of the image taking part of the conventional high-temperature atmosphere furnace interior observation unit.

BRIEF SUMMARY OF THE INVENTION

With the constitution described in Japanese Patent No. 2891672, it is possible to continuously observe the state of the inside of a high-temperature atmosphere furnace such as an electric furnace or a coke oven while efficiently cooling the imaging part, the heat ray cut filter, and the CCD camera, etc.

However, the electrical furnace and the coke oven are completely different in structure from a reaction chamber of a semiconductor manufacturing apparatus in a high-temperature atmosphere, and in conventional observation units, light to be made incident through the monitor window from the inside of the reaction chamber is excessively intensive (large in amount) and may cause overexposure (dimming) and obstruct the image taking.

Namely, normally, the temperature of a halogen lamp as heating means is expected to be 1727 through 2227° C., and on the other hand, the temperature of the semiconductor substrate and susceptor is about 1100° C., and by this temperature difference, the emission spectral region of the lamp is cut in the visible wavelength region and only radiant rays of the susceptor on the long wavelength side and radiant rays of the semiconductor substrate are transmitted and imaged by a camera, whereby the influence of the reflected light can be reduced, however, in actuality, at both of the temperatures, the overlapped spectra equally lower in intensity from the long wavelength side to the short wavelength side in the visible wavelength region, and considering the intensity ratio, most of the light to be made incident on the camera from the semiconductor substrate or the susceptor is light reflected from the lamp, so that when a wavelength region filter such as a wavelength discriminator is used, it is considered that the brightness of the entire image only lowers, and selective dimming of the lamp reflection image is not realized.

The present invention was made in view of the above-described points, and an object thereof is to provide an observation unit which can efficiently cool apparatus members in a reaction chamber of a semiconductor manufacturing apparatus in a high-temperature atmosphere and reduces overexposure.

To achieve the above-described object, an observation unit of the invention includes: imaging means for imaging the inside of a reaction chamber of a semiconductor manufacturing apparatus in an atmosphere of a high temperature; a housing case which houses the imaging means, and is attached with a translucent member which guides an optical image of the inside of the reaction chamber to the imaging means; and cooling medium supplying means for supplying a cooling medium to the inside of the housing case, wherein the translucent member is a silica glass plate having a gold film on both sides or one side.

Herein, by the cooling medium supplying means for supplying a cooling medium to the inside of the housing case, the imaging means and the translucent member can be cooled. By forming the translucent member of the housing case by a silica glass plate having a gold film on both sides or one side, transmission of light in the visible light region and light in the infrared region can be reduced.

In the observation unit of the present invention, when the translucent member has a $SiO_2$ (silica) film formed on the gold film, the gold film hardly peels off.

In the observation unit of the present invention, when the housing case consists of a first housing case for housing the imaging means and a second housing case for housing the first housing case, the imaging means can be easily protected from external heat.

In the observation unit of the present invention, when the cooling medium supplying means includes coolant gas supplying means for supplying a coolant gas to the inside of the first housing case and cooling water supplying means for supplying cooling water to the inside of a space formed between the first housing case and the second housing case, even if the imaging means is not waterproofed, a water-cooling method with high cooling capacity can be used.

The observation unit according to the invention can efficiently cool apparatus members in a reaction chamber of a semiconductor manufacturing apparatus in a high-temperature atmosphere and reduce overexposure.

BRIEF DESCRIPTION OF THE DRAWLNGS

FIG. 2 is a schematic view showing a state of observation of the inside of the reaction chamber by attaching the observation unit to which the invention is applied to a vapor phase epitaxial growth system.

DETAILED DESCRIPTION OF THE INVENTION

Hereinafter, an embodiment of the invention will be described with reference to the drawings for understanding of the invention.

Figure 1:
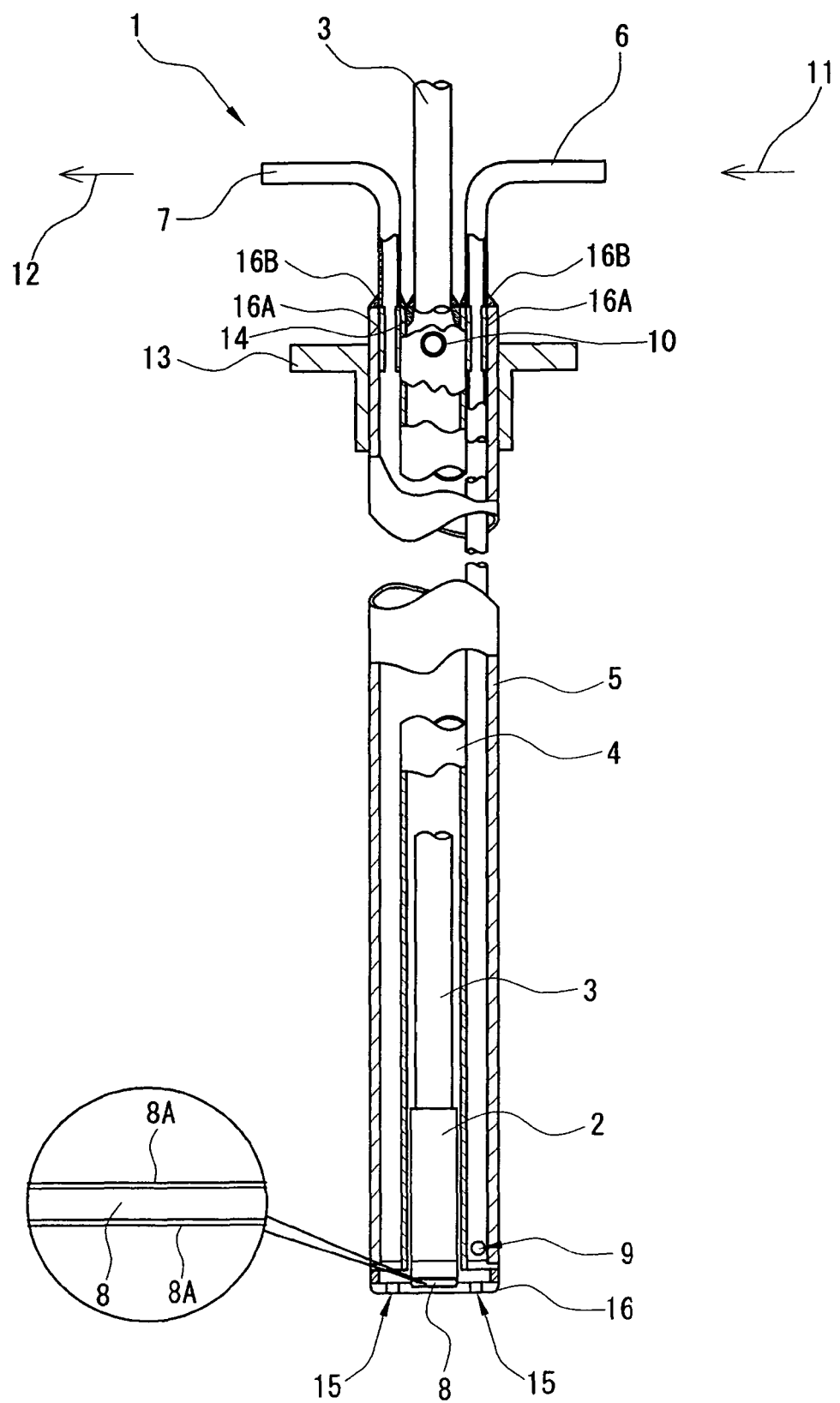
FIG. 1 is a schematic view of an observation unit to which the invention is applied.
Figure 3:
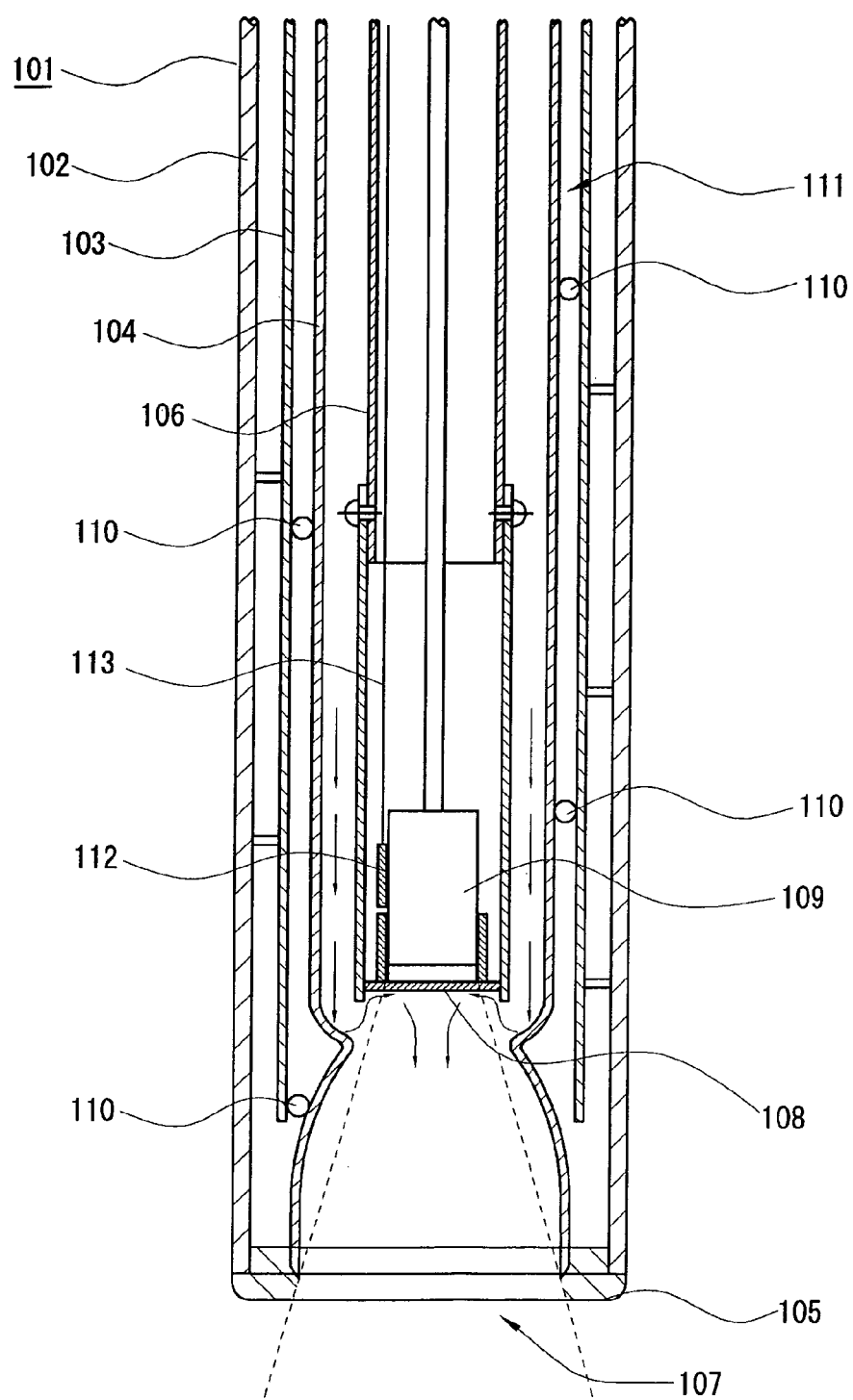
FIG. 3 is a schematic view of the imaging part of the conventional high-temperature atmosphere furnace interior observation unit.

FIG. 1 is a schematic view of an observation unit to which the invention is applied. The observation unit 1 of the invention includes a CCD camera 2 (an example of the imaging means) for imaging a state of the inside of a reaction chamber of a semiconductor manufacturing apparatus in a high-temperature atmosphere, an optical fiber cable 3 which connects the CCD camera and a control apparatus (not shown) that controls the CCD camera, a stainless steel-made inner cylinder 4 (an example of the first housing case) housing the CCD camera and the optical fiber cable 3, a stainless steel-made outer cylinder 5 (an example of the second housing case) housing the inner cylinder, a stainless steel-made cooling water supplying pipe 6 (an example of the cooling water supplying means) which is inserted into a space formed between the inner cylinder and the outer cylinder and has a tip end (end turned toward the inner side of the reaction chamber) sealed by welding and a water release port 9 formed in a side wall, a stainless steel-made cooling water discharge pipe 7 which is inserted into a space formed between the inner cylinder and the outer cylinder and discharges the cooling water supplied into the space to the outside, a circular silica glass plate 8 which is attached to the tip end (turned toward the inner side of the reaction chamber) of the inner cylinder and guides an optical image of the inside of the reaction chamber to the CCD camera and has a gold film 8A on both sides, a stainless steel-made coolant gas supplying pipe 10 (an example of the coolant gas supplying means) which is connected to a base end (end turned toward the outer side of the reaction chamber) of the inner cylinder and a base end of the outer cylinder and penetrates walls of these cylinders to supply a coolant gas (nitrogen gas or argon gas, etc.) to the inside of the inner cylinder 4, a fixing flange 13 which fixes the observation unit 1, a stainless steel-made closing plate 16 which is attached by welding to the tip ends of the inner cylinder and the outer cylinder and covers these, and is formed with a through hole at a substantially central region overlapping the silica glass plate and formed with a gas exhaust port 15 through which the coolant gas is exhausted, and a circular O-ring 16A which is inserted in a space formed between the inner cylinder and the outer cylinder and the cooling water supplying pipe and the cooling water discharge pipe are inserted in.

Herein, to prevent the cooling water and the coolant gas from leaking to the outside of the observation unit, the portion between the base end of the inner cylinder 4 and the optical fiber cable 3 is sealed by a silicone sealant 14, and the portion between the base ends of the inner cylinder 4 and the outer cylinder 5 and the O-ring 16A is welded and a welded portion 16B is formed for sealing these. The silicone sealant and O-ring may not be necessarily used as long as the cooling water and the coolant gas can be prevented from leaking to the outside of the observation unit.

The cooling water is supplied into the cooling water supplying pipe 6 in a cooling water supplying direction 11 and released in the space between the inner cylinder 4 and the outer cylinder 5 from the water release port 9, and the cooling water fills this space, and is discharged in a cooling water discharge direction 12 from the cooling water discharge pipe 7.

The coolant gas is supplied into the coolant gas supplying pipe 10 and passes through the inside of the inner cylinder 4, and is then exhausted to the outside through the gas exhaust port 15.

The diameter of the CCD camera 2 is approximately 7.5 mm, the diameter of the inner cylinder 4 is approximately 10.7 mm, the diameter of the outer cylinder 5 is approximately 24.8 mm, and the lengths of the inner cylinder and the outer cylinder are approximately 200 mm. The diameters of the cooling water supplying pipe 6, the cooling water discharge pipe 7, and the coolant gas supplying pipe are approximately 4 mm. The diameter of the release port 9 is approximately 2 mm, and the diameter of the silica glass plate 8 is approximately 10 mm. Herein, as a matter of course, these dimensions may be changed as appropriate as long as the observation unit includes the imaging means, the housing case which houses the imaging means and is attached with a translucent member for guiding an optical image of the inside of the reaction chamber to the imaging means, and the cooling medium supplying means for supplying a cooling medium to the inside of the housing case.

Herein, as long as the observation unit includes the imaging means, the housing case which houses the imaging means and is attached with a translucent member for guiding an optical image of the inside of the reaction chamber to the imaging means, and the cooling medium supplying means for supplying a cooling medium to the inside of the housing case, the CCD camera may not be necessarily used, and for example, a CMOS camera may be used, and the cooling water supplying pipe may not be necessarily disposed inside a space formed between the inner cylinder and the outer cylinder.

Furthermore, a closing plate to which the translucent member is attached may be attached to the housing case as long as the translucent member is attached to the housing case.

As long as the observation unit includes the imaging means, the housing case which houses the imaging means and is attached with a translucent member for guiding an optical image of the inside of the reaction chamber to the imaging means, and the cooling medium supplying means for supplying a cooling medium to the inside of the housing case, the observation unit may not necessarily have the double structure consisting of the inner cylinder and the outer cylinder, and for example, it may have a single structure consisting of only an inner cylinder or a triple structure using a third cylinder that houses the outer cylinder. The case for housing the CCD camera, etc., may not be necessarily in a cylindrical shape, and it may be, for example, a hollow body with a quadrilateral section. Both of a coolant gas and cooling water may not be necessarily supplied, and only a coolant gas may be supplied or only cooling water may be supplied.

As long as the imaging means such as a CCD camera, etc., can be protected from heat, the inner cylinder and the outer cylinder may not be necessarily made of stainless steel, and may be made of, for example, heat resistant steel, copper alloy, aluminum alloy, titanium, glass, or ceramic.

A gold film is formed on both sides of the silica glass plate, however, the gold film may be formed on only one side, and a $SiO_2$ (silica) film may be formed on the gold film, or a gold film is formed on one side and a different metal film is formed on the other side.

The silica glass plate having a gold film formed on both sides was irradiated with light beams with wavelengths from wavelengths in the visible light region to wavelengths in the infrared region, and transmitted light amounts were measured with a spectrophotometer. The light path was divided into two systems, and a light amount transmitted through the silica glass plate having a gold film on both sides and a light amount transmitted through the air were simultaneously measured and a ratio of these was evaluated as a transmittance (%). As a result, the transmittance of light with a wavelength in the visible light region was 1 to 2 percent, and the transmittance of light with a wavelength in the infrared region was substantially 0 percent.

The transmittance of the light with a wavelength in the visible light region was 1 to 2 percent, so that it was found that by guiding an optical image to the CCD camera by the silica glass plate having a gold film on both sides, only minimum light necessary for image taking was transmitted and overexposure (dimming) was reduced, and the transmittance of light with a wavelength in the infrared region was substantially 0 percent, so that heat rays did not reach the CCD camera through the silica glass plate having a gold film on both sides, so that the CCD camera was hardly heated.

FIG. 2 is a schematic view showing a state of observation of the inside of the reaction chamber by attaching the observation unit to which the present invention is applied to a vapor phase epitaxial growth system.

In FIG. 2, the observation unit 1 to which the invention is applied is inserted into a hole formed between halogen lamps 22A of a lamp unit 22 including a plurality of halogen lamps 22A and a reflecting plate 22B which is made of an aluminum alloy and has a gold film on a surface, and fixed to the lamp unit 22 of the vapor phase epitaxial growth system by a fixing flange 13, and observes the inside of the reaction chamber in a high-temperature atmosphere through an upper quartz dome 21 forming the reaction chamber 18 of the vapor phase epitaxial growth system. A coolant gas is supplied into the coolant gas supplying pipe 10 in the coolant gas supplying direction 17 and passes through the inside of the inner cylinder 4 and the gas exhaust port, and is then exhausted to the outside of the observation unit 1 in the coolant gas exhaust direction 17A.

Inside the reaction chamber 18, a susceptor 19 is disposed, and on this susceptor 19, a semiconductor substrate 20 is placed. To the inside of the reaction chamber 18, a reactive gas containing an $SiHCl_3$ gas and a hydrogen gas is supplied, and the inside of the reaction chamber 18 is in an atmosphere of a high temperature of about 1100° C. due to the halogen lamp 22A, and silicon single crystal is grown on the semiconductor substrate 20.

The CCD camera 2 is connected to the control apparatus 23 which controls the CCD camera by the optical fiber cable 3, and furthermore, the control apparatus 23 is connected to a display unit 24 which displays a video image of the inside of the reaction chamber taken by the CCD camera 2 by a signal cable 3A.

Herein, a signal cable may be used instead of the optical fiber cable as long as the CCD camera can be controlled and a video image taken by the CCD camera can be displayed on the display unit, and the connection between the CCD camera and the control apparatus and the connection between the control apparatus and the display unit may not be necessarily made, and for example, signals may be exchanged between these wirelessly.

Furthermore, when a thermo label (not shown) which detects (changes in color at a temperature equal to or more than 40° C.) a temperature equal to or more than 40° C. was affixed to the surface of the outer cylinder 5 of the observation unit 1 and the inside of the reaction chamber of the semiconductor manufacturing apparatus in a high-temperature atmosphere of about 1100° C. was observed with the observation unit 1, the thermo label (not shown) did not change in color. Thereby, it was found that even when the observation unit was set near the halogen lamp which made the high-temperature atmosphere of about 1100° C. of the inside of the reaction chamber and the inside of the reaction chamber of the semiconductor manufacturing apparatus was observed, the temperature near the CCD camera was less than 40° C., and sufficient cooling was obtained.

On the other hand, when the inside of the reaction chamber of the semiconductor manufacturing apparatus in a high-temperature atmosphere of about 1100° C. was observed without cooling, the CCD camera was broken and became unusable.

Thus, according to the observation unit to which the invention is applied, the imaging means and the translucent member can be cooled by the cooling medium supplying means for supplying a cooling medium such as a coolant gas or cooling water to the inside of the housing case housing the imaging means, and by forming the translucent member of the housing case by a silica glass plate having a gold film on both sides or one side, the transmission of light in the visible light region and light in the infrared region can be reduced, so that the apparatus members can be efficiently cooled in the reaction chamber of the semiconductor manufacturing apparatus in a high-temperature atmosphere, and overexposure can be reduced. Namely, light in the infrared region having heating property can be prevented from entering the imaging means through the silica glass plate, and the apparatus members are efficiently cooled by a cooling medium, and entering of light in the visible light region into the imaging means through the silica glass plate can be reduced, so that excessive brightness can be prevented and overexposure can be reduced.

In addition, when the apparatus members can be efficiently cooled inside the reaction chamber of the semiconductor manufacturing apparatus in a high-temperature atmosphere and overexposure can be reduced, so that it can be judged through observation as to whether the semiconductor substrate has been deformed during epitaxial crystal growth reaction, and the state and situation of the inside of the reaction chamber during the epitaxial crystal growth reaction, including a phenomenon in which the semiconductor substrate is displaced from a predetermined position on a susceptor on which the semiconductor substrate is placed and a phenomenon in which the semiconductor substrate is damaged, can be observed.

The observation unit to which the invention is applied has a double structure formed by a first housing case housing the imaging means and a second housing case housing the first housing case, so that the imaging means can be easily protected from external heat, and the apparatus members can be more efficiently cooled.

In the observation unit to which the invention is applied, the cooling medium supplying means includes coolant gas supplying means for supplying a coolant gas to the inside of the first housing case and cooling water supplying means for supplying cooling water to the inside of the space formed between the first housing case and the second housing case, so that a water-cooling method with high cooling capacity can be used even if the imaging means is not waterproofed, and the apparatus members can be more efficiently cooled.

The invention claimed is:

1. An observation unit comprising:
   imaging means for imaging an inside region of a reaction chamber of a semiconductor manufacturing apparatus in a high temperature atmosphere
   a housing case which houses the imaging means;
   a plate-like translucent member attached to a tip end of the housing case; and
   a cooling medium supplying means for supplying a cooling medium to the inside of the housing case;
   wherein the translucent member is a silica glass plate having a gold film on both sides or one side, the translucent member being adapted to transmit light with a wavelength in a visible light region, to intercept light with a wavelength in an infrared region, and
   wherein the imaging means is adapted to image the inside region of the reaction chamber of the semiconductor manufacturing apparatus in the high-temperature atmosphere through the translucent member.

2. The observation unit according to claim 1, wherein the translucent member has a SiO$_2$ (silica) film formed on the gold film.

3. The observation unit according to claim 1, wherein the housing case consists of a first housing case for housing the imaging means and a second housing case for housing the first housing case.

4. The observation unit according to claim 1, wherein the cooling medium supplying means comprises:
   coolant gas supplying means for supplying a coolant gas to the inside of the first housing case; and
   cooling water supplying means for supplying cooling water to the inside of a space formed between the first housing case and the second housing case.

5. The observation unit according to claim 1, wherein in the translucent member, transmittance of light with a wavelength in the visible light region is about 1 to 2% and transmittance of light with a wavelength in the infrared region is 0%.

6. An observation unit comprising:
   imaging means for imaging an inside region of a reaction chamber of a semiconductor manufacturing apparatus heated by a radiation heat source which forms a high temperature atmosphere during manufacture of a semiconductor device situated within the reaction chamber;
   a housing case which houses the imaging means;
   a plate-like translucent member attached to a tip end of the housing case; and
   a cooling medium supplying means for supplying a cooling medium to the inside of the housing case;
   wherein the translucent member is a silica glass plate having a gold film on both sides or one side, the silica plate being adapted to transmit light with a wavelength in a visible light region, to intercept light with a wavelength in an infrared region, and thereby to reduce overexposure attributable to radiation of the radiant heat source during operation of the radiant heat source during manufacture of the semiconductor device, and
   wherein the imaging means is adapted to image the inside region of the reaction chamber of the semiconductor manufacturing apparatus in the high-temperature atmosphere through the translucent member.

7. The observation unit according to claim 6, wherein the translucent member has a SiO$_2$ (silica) film formed on the gold film.

8. The observation unit according to claim 7, wherein in the translucent member, transmittance of light with a wavelength in the visible light region is about 1 to 2% and transmittance of light with a wavelength in the infrared region is 0%.

9. The observation unit according to claim 6, wherein in the translucent member, transmittance of light with a wavelength in the visible light region is about 1 to 2% and transmittance of light with a wavelength in the infrared region is 0%.

10. The observation unit according to claim 6, wherein the housing case consists of a first housing case for housing the imaging means and a second housing case for housing the first housing case.

11. The observation unit according to claim 6, wherein the cooling medium supplying means comprises:
    coolant gas supplying means for supplying a coolant gas to the inside of the first housing case; and
    cooling water supplying means for supplying cooling water to the inside of a space formed between the first housing case and the second housing case.

* * * * *